United States Patent [19]

Dimmler et al.

[11] Patent Number: 4,809,225

[45] Date of Patent: Feb. 28, 1989

[54] MEMORY CELL WITH VOLATILE AND NON-VOLATILE PORTIONS HAVING FERROELECTRIC CAPACITORS

[75] Inventors: Klaus Dimmler; S. Sheffield Eaton, Jr., both of Colorado Springs, Colo.

[73] Assignee: Ramtron Corporation, Colorado Springs, Colo.

[21] Appl. No.: 69,390

[22] Filed: Jul. 2, 1987

[51] Int. Cl.$^4$ .................. G11C 11/22; G11C 11/24; G11C 11/00; G11C 11/34

[52] U.S. Cl. .................. 365/145; 365/149; 365/185; 365/154; 365/228

[58] Field of Search ............... 365/149, 154, 156, 190, 365/185, 228, 145, 117, 65

[56] References Cited

U.S. PATENT DOCUMENTS

| | | | |
|---|---|---|---|
| 3,158,842 | 11/1964 | Anderson | 365/145 |
| 4,144,591 | 3/1979 | Brody | 365/228 X |
| 4,300,212 | 11/1981 | Simko | 365/185 X |
| 4,499,560 | 2/1985 | Brice | 365/228 X |
| 4,630,238 | 12/1986 | Arakawa | 365/185 X |

FOREIGN PATENT DOCUMENTS

| | | | |
|---|---|---|---|
| 242117A1 | 1/1987 | Fed. Rep. of Germany | 365/149 |
| 60-31665 | 2/1985 | Japan | 365/228 |

OTHER PUBLICATIONS

RTD Technical Documentary Report, No. RTD-T-DR-63-4002, Oct. 1963, pp. 1-43, "Research on the Application of Ferro- and Ferrielectric Phenomena in Computer Devices", by Pulvari.

*Primary Examiner*—Stuart N. Hecker
*Assistant Examiner*—Alfonso Garcia
*Attorney, Agent, or Firm*—Edward D. Manzo

[57] ABSTRACT

A memory cell includes an SRAM flip-flop cell having two nodes coupled to ferroelectric capacitors so that when the SRAM is powered down, the ferroelectric devices store data and upon power up, transfer the stored data to the SRAM cell. The ferroelectric devices can be bypassed during normal SRAM operations to reduce hysteresis fatigue.

8 Claims, 1 Drawing Sheet

MEMORY CELL WITH VOLATILE AND NON-VOLATILE PORTIONS HAVING FERROELECTRIC CAPACITORS

BACKGROUND OF THE INVENTION

The present invention relates to semiconductor memories. It combines the advantages of ferroelectric devices, such as non-volatility and radiation hardness, with the durability and other advantages of other types of memories such as static RAMS and dynamic RAMS.

Memory technology today includes several different techniques. The general population is aware that information can be stored on magnetic tape, as magnetic tape is used for video and audio recording. Such applications involve storing information in magnetic fields on a magnetic medium. In the case of audio or video applications, the stored information is written and read in a serial fashion so that consecutive video images or audio sounds can be recorded or played back. Magnetic tape is a non-volatile memory in that power need not be supplied continuously to this storage medium in order to preserve the information stored therein.

Similarly, bubble memories also store information in magnetic domains and are non-volatile. However, magnetic bubble memories, like magnetic tape, must be accessed serially.

It is a common practice today among computer users to store information or programs which have been developed or updated using their computers in a medium which is non-volatile so that in the event of a power outage or a mistake, data can be retrieved. This is one of the salient advantages of non-volatile memories. Magnetic floppy discs are commonly used for this purpose today.

However, high speed processing requires that information stored in memory be randomly accessible. Consequently, over the past several decades, memory technology has developed various types of random access memories. Generally these involve semiconductor technology, which operates at high speed, although magnetic random access memories may have been addressed. In semiconductor random access memories ("RAMS"), a bit of binary information is stored in a memory cell, and cells are grouped together into arrays. It is common practice today to include numerous bit lines, each bit line being coupled to several memory cells, and an orthogonal group of word lines, each of which is coupled to several memory cells. Various address decoders identify one cell to be accessed. Thus, by specifying an address, a RAM is able to access a single memory cell in an array of thousands of memory cells and read or write data from or into that addressed memory cell. This cell may be used repeatedly and accessed very quickly, sometimes in a few dozen nanoseconds. These capabilities are quite important to computer and data processing applications.

RAMS are further categorized as being either "dynamic" or "static." This distinction generally follows from the type of memory cell incorporated in the RAM. In the case of a dynamic RAM memory cell, data is stored in a capacitor, part of which is found in a substrate of semiconductor material. A transistor selectively couples the capacitor to a bit line. Because of this simple construction, dynamic RAM ("DRAM") memory cells are small in area and can be fabricated with substantial density. On the other hand, because the charge is stored in a capacitor in the substrate, the charge dissipates and needs to be refreshed periodically in order to preserve the content of the memory.

Static RAMS differ from dynamic RAMS by having memory cells which do not need to be refreshed. A static RAM cell usually includes several transistors configured as a flip-flop which has two stable states. These two states are used for storing the two different levels of binary data. Static RAM cells, because they include several transistors, are larger than DRAM cells and therefore cannot be packed as densely on semiconductor chips. On the other hand, static RAMS operate quickly and do not require the logic circuitry needed for refresh operations.

Both dynamic RAMS and static RAMS, while having the advantage of being randomly accessible, have the disadvantage of being volatile. That is, when power is removed from the memories, the data dissipates. The charge stored in the capacitors in the memory cells of the dynamic RAMS dissipates, and the voltage used to preserve the flip-flop states in the static RAM memory cells drops to zero so that, in short order, the flip-flop loses its data.

RAMS using ferroelectric capacitors for memory cells have a significant advantage of being non-volatile. Briefly, a ferroelectric capacitor includes a pair of capacitor plates with a ferroelectric material between them. A ferroelectric material has two different stable polarization states which can be defined with a hysteresis loop seen by plotting the polarization against applied voltage. By measuring the charge which flows when a voltage is applied to a ferroelectric capacitor, one can determine the polarization state of the ferroelectric material. By assigning a binary zero to one polarization state and a binary one to the other polarization state, ferroelectric capacitors can be used to store binary information. The advantage, of course, of a non-volatile memory is that even though power may be interrupted or removed from the memory, data will continue to be stored. Another advantage of ferroelectric materials in particular is that they have been found to be radiation hard.

However, a disadvantage is that certain ferroelectric materials have been found to exhibit fatigue characteristics which result in decreasing polarization as the ferroelectric capacitor is switched repeatedly from one polarization state to the other, millions of times.

It is an object of the present invention to provide a non-volatile semiconductor memory using ferroelectric materials, but overcoming the problem of polarization fatigue and having the advantages of random access and high speed.

SUMMARY OF THE INVENTION

According to various aspects of the present invention, a volatile memory cell, whether of the static, dynamic, or other type, is combined with a ferroelectric device or circuit. During the normal usage of one embodiment of the invention, the ferroelectric material polarization is not switched, despite repeated access to the memory cell. However, upon prescribed conditions such as power down, the ferroelectric device is written into so that the data stored in the memory cell will be preserved in the ferroelectric device despite the loss of power. When the memory is powered-up again, the information is retrieved from the ferroelectric device and restored into the volatile portion of the memory cell. This reduces the number of times the ferroelectric is switched, greatly extending the lifetime of the product.

Other aspects of the present invention will become apparent from the following detailed description of a preferred embodiment. It may be noted that at this juncture, however, while the preferred embodiment uses a static RAM memory cell, the invention is not limited to combining ferroelectric capacitors with static RAM memory cells.

BRIEF DESCRIPTION OF THE DRAWINGS

In describing preferred embodiment of the present invention, reference is made to the accompanying figures wherein.

DESCRIPTION OF PREFERRED EMBODIMENTS

I. First Embodiment

Figure 1A:
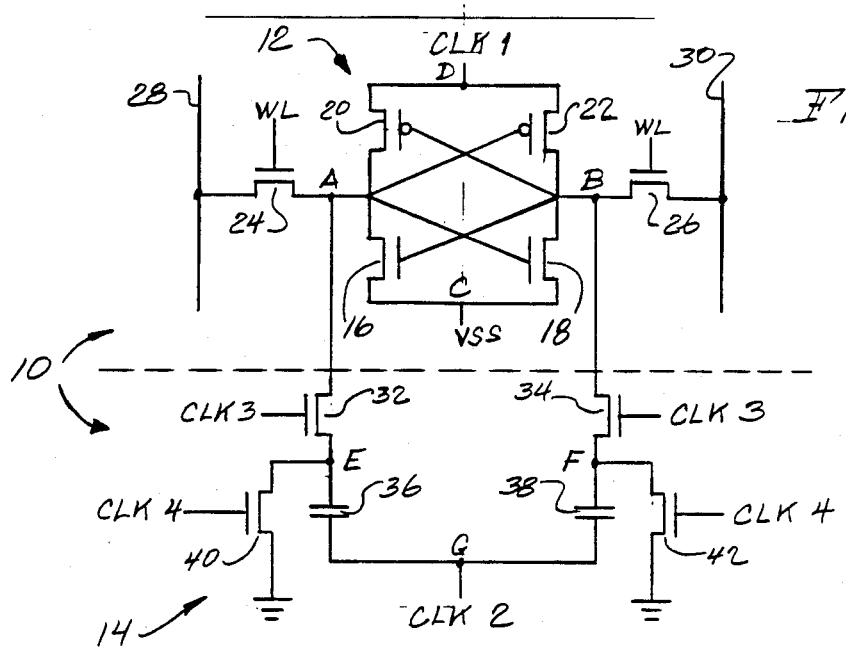
FIG. 1A represents a static RAM memory cell constructed in accordance with various aspects of the present invention.

FIG. 1A shows a memory cell 10 combining ferroelectric devices with non-ferroelectric memory cell technology. Memory cell 10 comprises first and second portions 12 and 14. Portion 12 comprises a volatile memory cell whereas portion 14 comprises circuitry including ferroelectric devices coupled to the first portion. It will be seen that portion 12 uses a CMOS static RAM cell, but it must be understood that such a memory cell is illustrative only and that other types of memory cells can be used.

Thus, portion 12 includes a flip-flop formed by two n-channel transistors 16, 18 and two p-channel transistors 20, 22. A pair of nodes A and B are cross coupled to the gate electrodes of transistors 16 to 22. A node C is set at the VSS level of zero volts. A further node D couples the source electrodes of the p-channel transistors 20, 22 to a signal CLK1, which is normally at a full VCC level. The source-drain paths of access transistors 24 and 26 couple internal nodes A and B, respectively, to bit lines 28, 30. The gate electrodes of access transistors 24, 26 are coupled to word lines.

Nodes A and B are coupled, illustratively by the source-drain paths of a further pair of transistors 32, 34, to upper plates of a pair of ferroelectric capacitors 36, 38. (It will be understood that a full CMOS pass gate can be used, or that p-channel transistors with reverse logic can be substituted for the embodiment illustrated in FIG. 1A.) For ease of explanation, it will be convenient to refer to the junction between transistor 32 and capacitor 36 as node E and the connection between transistor 34 and capacitor 38 as node F. The lower plates of capacitors 36, 38 are electrically coupled at a node G, which is coupled to a logic signal CLK2, normally kept in a low state. Transistors 32 and 34, between nodes A and E, and B and F respectively are gated by a logic signal CLK3. Also included in this embodiment are shorting transistors 40, 42 corresponding respectively to capacitors 36, 38. The source-drain paths of shorting transistors 40, 42 selectively couple nodes E and F to VSS. The gate electrodes of transistors 40, 42 are coupled to a logic signal CLK4.

a. Normal Operation

Figure 1B:
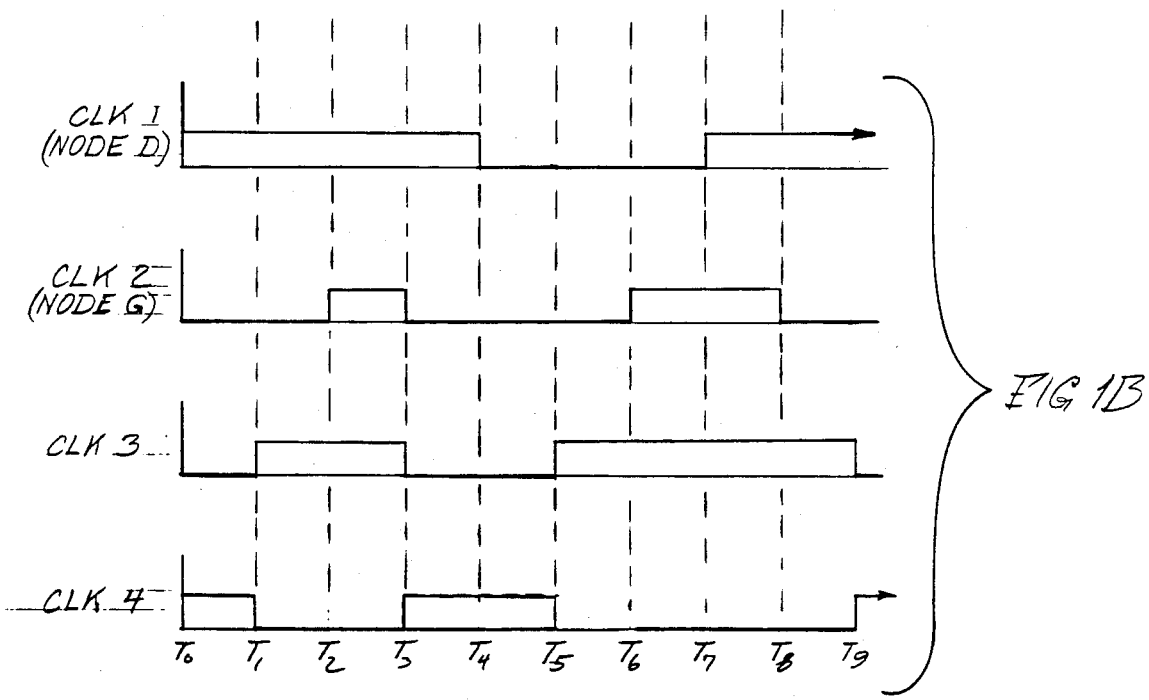
FIG. 1B represents a timing diagram for both the store cycle and the recall cycle for the memory cell of FIG. 1A.

Referring to FIG. 1B, in normal operation from time $T_0$ to $T_1$, CLK1 (node D) is high (at VCC). Logic signals CLK2 and CLK3 are both low. Thus, transistors 32 and 34 will be in an off condition so that first portion 12 will be decoupled from second portion 14. Voltage transitions occurring at nodes A and B through the normal usage of memory cell portion 12 will not be communicated directly to ferroelectric capacitors 36, 38. However, as a further precaution, signal CLK4 can be high when signal CLK3 is low. Accordingly, shorting transistors 40, 42 are thereby turned on so that capacitors 36, 38 are shorted. This avoids DC components across these ferroelectric capacitors. It will be appreciated that logic signal CLK4, together with transistors 40, 42, could be eliminated in a modification of this embodiment if the ferroelectric devices are not particularly sensitive to DC breakdown.

Thus, when the foregoing conditions occur, volatile portion 12 of the memory cell is fully functional as a static RAM memory cell, and may be accessed via its bit lines 28, 30 and word line to read and write data into the flip-flop formed by the cross-coupled transistors 16, 18, 20 and 22.

b. Store To Non-Volatile Operation

When it becomes necessary at an arbitrary time $T_1$ to copy the information stored in volatile portion 12 into non-volatile portion 14, logic signal CLK3 is brought up from zero volts to a high level. For purposes of explanation, assume that the data stored in portion 12 is such that node A is at a low voltage level (VSS) and node B is at a high voltage level (VCC). CLK1 stays high at node D. The high level at node B will raise the voltage level at node F when transistor 34 turns on. CLK4 is dropped low and CLK3 is brought high to permit ferroelectric capacitors 36, 38 to charge up. CLK2 at node G is still low, so that as node F rises in voltage, capacitor 38 will be driven to a polarization state that may be referred to as "high." There is a possibility that the previous state of ferroelectric capacitor 38 was "low." If this is the case, a polarization reversal current will be drawn from the internal node B of the static RAM cell. This current must be supplied by the pull-up device 22 of the static cell such that the voltage does not drop below the switching voltage of the static cell. The magnitude of this current, supplied by transistor 22 and node B, can be controlled by the relative device sizes of capacitor 38 and transistor 22, as well as the parasitic capacitance of node B.

Now the other ferroelectric capacitor at this embodiment should be set. To do this, beginning at time $T_2$, signal CLK2 is brought high, raising node G in voltage. Because node A in the volatile cell is at a logic low level, node E will also be at a low level, and the voltage across ferroelectric capacitor 36 writes a polarization state into capacitor 36 which may be referred to as "low." As before, the possibility exists that this will constitute an overwrite of the previous information. If this is the case, current will be injected into the internal node A of the static cell. The pull-down device 16 in the static cell must be sufficient in size to keep the voltage at the node below the static cell's switching voltage. The current through capacitor 36 should be less than the current to flip the static cell. (This is controlled by the sizes of capacitor 36 and transistor 16, as well as the parasitic capacitance of node A.)

At time $T_3$, the information in the volatile cell is stored in ferroelectric capacitors 38, 40. The high node of the static cell corresponds to a ferroelectric capacitor being in a "high" polarization state, and the low level at the other internal node of the static cell has been written into another ferroelectric capacitor, the polarization state of which can be characterized as "low." It will be appreciated that the different polarization states of a ferroelectric capacitor can be assigned arbitrarily to "high" and "low" connotations of logic level. Consequently, the memory can be powered down at time $T_3$ without loss of information, and signals CLK1, CLK2, CLK3 and CLK4 all are at zero volts. Even though all voltages may drop to zero, the polarization states of capacitors 36, 38 remain so that the information is preserved.

It may be noted that while the user is free to power down the part at time $T_3$ without loss of data, there may be a variety of reasons to continue normal operations of the static RAM. Such normal operation can be restored to portion 12 while preserving the data in portion 14 by bringing CLK2 low again. CLK3 can be brought low to decouple portion 14 from portion 12. Following this, the ferroelectric capacitor plates can be shorted by raising CLK4 to turn on transistors 40, 42, as shown FIG. 1B from time $T_3$ to $T_4$. At a later time, the memory can be powered down with CLK1 and CLK4 both dropping low.

c. Recall From Non-Volatile to Volatile Operation

If cell 10 has been powered down, the information stored in non-volatile portion 14 can be restored to volatile portion 12 on power up. It should be appreciated that a recall operation can also be entered from a normal operation. If the recall cycle is entered from a power-up cycle, levels corresponding to "normal" operation are set up before the initiation of a recall cycle. This transfer from the ferroelectric devices to the static cell can be achieved in various ways. Preferably, at time $T_4$, CLK1 is set low to drop node D to ground, as indicated in FIG. 1B, thereby to disable the p-channel devices in the static cell. Signal CLK4 is high at time $T_4$ so nodes A and B will be precharged to zero volts through transistors 32 and 34 from time $T_4$ to $T_5$ (Alternatively, A and B can be precharged to zero by dropping bit lines 28, 30 to zero and pulsing the word line WL before CLK3 goes low.) Then at time $T_5$, CLK3 is brought high to couple nodes E and F to nodes A and B.

At time $T_6$, shorting transistors 40 and 42 are turned off by bringing CLK4 low. Node G is brought high at the same time by bringing CLK2 to a high logic level. The voltage across ferroelectric capacitors 36, 38 is now in a direction such that the capacitor having a "high" polarization state will experience a polarization reversal. That ferroelectric capacitor will deliver more current to its corresponding internal static cell node (A or B) than the ferroelectric capacitor which had been written to a "low" polarization state and which will not undergo a polarization change at this time. It should be noted that the capacitance of the internal nodes A and B of the static cell is such that the voltage on those nodes stays low enough so that at least partial reversal of polarization occurs on the ferroelectric capacitor 36 or 38 which had been written to the "high" polarization state. When this condition is true, then the voltage on the internal node of the static cell corresponding to the high polarization state capacitor will be slightly higher than the other node. When either node A or node B reaches one volt, the n-channel transistors 16, 18 are initialized.

At time $T_7$, CLK1 can be brought high with a controlled rise time. When the internal nodes settle, say at time $T_8$, the ferroelectric capacitor in the "low" polarization state will be refreshed. CLK2 can now be brought low and the "high" polarization state will thereby be refreshed. At time $T_9$, CLK3 can be brought low and CLK4 brought high to disengage non-volatile portion 14 from volatile portion 12 and to short the plates of capacitors 36, 38. This brings the circuit to the same conditions existing at time $T_0$, permitting normal SRAM operation. The purpose of timing $T_8$-$T_9$ is to restore the polarization state that was lost in the ferroelectric capacitor containing the "high" state. This polarization was lost at time $T_6$ when CLK2 was brought high. At that time, one of the ferroelectric capacitors switched, giving rise to a larger current than the other capacitor. This imbalance in current is used to flip the static RAM cell in a direction such that the high current side corresponds to the high voltage state. Now the ferroelectric capacitor on the "high" state side is partially switched with 5 v on each terminal (or 0 v across the ferroelectric). When CLK2 is brought low again, the voltage across this ferroelectric is in the direction to restore the "high" polarization state.

If the capacitance on internal nodes A and B of the static cell is insufficient to ensure partial reversal of polarization of whichever capacitor 36 or 38 had been brought to the "high" polarization state when CLK2 is brought high, then other cycles can be used.

For example, bit lines 28 and 30 can be used as additional capacitance. These are brought to a low voltage level and one of the word lines (coupled to gate electrodes of transistors 24, 26) is brought high. Now the same cycle can be performed as first specified above for the restore operation. The columns now provide a higher capacitance. When this cycle is completed, the word line is brought low. The cycle is repeated for all word lines. According to this latter technique, the cells can be restored only one row at a time.

Illustrative time durations for these cycles depend on the switching speed of the type of ferroelectric material used. In the case of $KNO_3$ the following is quite reasonable:

STORE CYCLE:

$T_0$-$T_1$: These levels represent normal static RAM cell operation. Duration is irrelevant.

$T_1$-$T_2$: The "high" polarization state is stored into one ferroelectric device. (1-10 μs)

$T_2$-$T_3$: The "low" polarization state is stored into the other ferroelectric device. (1-10 μs)

$T_3$-$T_4$: These levels represent normal static RAM cell operation. Duration is irrelevant.

RECALL CYCLE:

$T_4$-$T_5$: VCC power is disabled from the cell, and internal nodes are precharged. The duration of this step is determined by how long it takes to bring CLK1 low. This is likely to be a highly capacitive runner. (100 ns)

$T_5$-$T_6$: Connection is established between nodes A and E, and B and F. The duration is determined by the RC delay of CLK3. (15 ns)

$T_6$-$T_7$: The ferroelectric capacitors are sensed. The duration is determined by the time it takes to develop a discrimination current between the switching and non-switching ferroelectric capacitors. (20 ns-50 ns)

T7-T8: VCC power is restored to the static cell. CLK1 capacitance will be the overall speed limiter. (100 ns)

T8-T9: The ferroelectric in the "high" polarization state must be rewritten. The speed is determined by the switch speed of the ferroelectric. (1 μs–10 μs)

T9- The ferroelectric capacitors are isolated and shorted. The duration is determined by the slew rate of CLK3 and CLK4. (20 ns)

II. Second Embodiment

Figure 2:
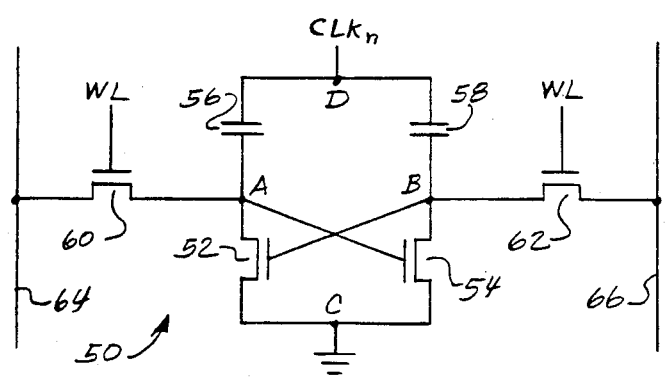
FIG. 2 shows another memory cell according to the present invention.

FIG. 2A illustrates a further memory cell 50 according to the present invention. In this embodiment, the ferroelectric capacitors are located in the volatile static cell and perform a dual function. Cell 50 comprises a pair of cross-coupled n-channel transistors 52, 54. The gate electrodes thereof are coupled to internal nodes A, B which are, in turn, coupled to the lower electrodes of corresponding ferroelectric capacitors 56, 58. The upper plates of capacitors 56, 58 are coupled at node D to a clock signal $CLK_n$ (where n represents a row index number). Such clock signal provides a switchable source of operating voltage. The sources of transistors 52, 54 are coupled at node C to a reference potential VSS or ground. Nodes A and B are coupled via the source-drain paths of access transistors 60, 62 to bit lines 64, 66. Transistors 60 and 62 are gated by word lines. Current to maintain data during normal operations is supplied through the ferroelectric capacitors which perform the resistive load function for the static cell. The resistance properties of many ferroelectric capacitors, including phase III potassium nitrate, are similar to that found for polysilicon resistors or polysilicon diodes used as resistors in current static RAM cells.

The store and recall operations of this cell are as follows: To store, the word line WL is high, and complementary bit lines 64, 66 receive the data from nodes A and B. The sense amplifier (not illustrated here, but coupled to the bit lines) latches the data and puts full CMOS levels on the bit lines. After a short interval, one of ferroelectric capacitors 56, 58 will have been written to a "low" polarization state by virtue of a low voltage (zero) on one of nodes A or B and a full VCC level at node D. Thereafter, $CLK_n$ for this row of cells is brought low, permitting the other capacitor 56 or 58 to be written to a "high" polarization state. At this time, the nonvolatile elements of cell 50 are set, and CLK can be brought high, and the word line WL dropped low. The next row (corresponding to the next word line in succession) can be stored in the same fashion after the bit line(s) are recovered.

To recall data from the nonvolatile portion into the volatile portion, bit lines 64 and 66 are precharged to zero volts. The word line WL is brought high, so nodes A and B are precharged to zero volts also. Word line WL is then brought low again. Then CLK is raised, and one of the ferroelectric capacitors 56, 58 will draw more current than the other (due to different polarization states), thereby setting the volatile cell, as required.

The foregoing description of various embodiments is intended to illustrate how various aspects of the present invention can be applied, but the preferred embodiments can be modified without departing from the true spirit of this invention. For example, it will be appreciated that while the embodiments described herein use two ferroelectric capacitors, in some modifications only one such capacitor might be employed—as it is capable of representing two different states. Accordingly, the scope of protection to be afforded to the present invention is defined by the following claims taken in light of the specification.

What is claimed as the invention is:

1. A method of operating a memory cell having volatile and nonvolatile portions, said non-volatile portion including first and second ferroelectric capacitors each having first and second plate electrodes, the method comprising the steps of:
    storing complementary binary data in said volatile portion, including developing high and low voltages representing the complementary data at first and second nodes of the volatile memory cell portion;
    coupling said first and second nodes to the first plate electrodes of the first and second ferroelectric capacitors;
    polarizing only one of said ferroelectric capacitors by applying a low voltage to the second plate electrode thereof while the first plate electrode of said capacitor is coupled to said first or second node, said polarizing occurring in a first direction; thereafter
    polarizing the second ferroelectric capacitor by raising the voltage on the second plate electrode thereof while the first plate electrode is coupled to said first or second node, said polarizing occurring in a second direction.

2. The method according to claim, 1 wherein a third node is coupled to the second plate electrodes of each of said first and second ferroelectric capacitors, and wherein said polarizing steps comprise sequentially applying a low voltage and then a high voltage to said third node while coupling said first and second node to the first plate electrodes of said first and second ferroelectric capacitors.

3. The method according to claim 1 further comprising removing power from said memory cell after said polarizing steps.

4. The method according to claim 1 further comprising shorting said first plate electrodes of the first and second ferroelectric capacitors to ground during said storage of complementary data in the volatile memory cell portion.

5. The method according to claim 1 further comprising recalling the data from said ferroelectric capacitors to said volatile memory cell portion including:
    pre-charging said first and second nodes;
    coupling the first plate electrodes of the said first and second ferroelectric capacitors to the first and second nodes respectively;
    impressing a high voltage on a third node coupled to the second plate electrodes of both said first and second ferroelectric capacitors thereby to cause a polarization reversal in only one of said capacitors and causing a voltage to develop on said first or second node, thereby initializing the volatile memory cell portion.

6. The method according to claim 5 further comprising after said initializing, then applying a low voltage to said third node thereby to restore a polarization state to said one ferroelectric capacitors.

7. A method of operating a memory cell including first and second ferroelectric capacitors each having first and second plate electrodes, the method including volatile and nonvolatile operations and comprising the steps of:
    storing complementary binary data in a volatile manner, including developing high and low voltages representing the complementary data at first and second nodes within the memory cell;

coupling said first and second nodes to the first plate electrodes of the first and second ferroelectric capacitors;

polarizing only one of said ferroelectric capacitors by applying a high voltage to the second plate electrode thereof while the first plate electrode thereof is coupled to said first or second node, said polarizing occurring in a first direction; thereafter polarizing the second ferroelectric capacitor by dropping the voltage on the second plate electrode thereof while the first plate electrode is coupled to said first or second node, said polarizing occurring in a second direction.

8. The method of claim 7 wherein a third node is coupled to said second plate electrodes of both of said first and second ferroelectric capacitors, and wherein said polarizing steps include sequentially applying a high voltage and then a low voltage to said third node.

* * * * *